US009826073B2

(12) United States Patent
Park et al.

(10) Patent No.: US 9,826,073 B2
(45) Date of Patent: Nov. 21, 2017

(54) WATCH TYPE MOBILE TERMINAL

(71) Applicant: LG ELECTRONICS INC., Seoul (KR)

(72) Inventors: Kyungui Park, Seoul (KR); Donghyun Kim, Seoul (KR); Joseph Lee, Seoul (KR); Wonkee Ahn, Seoul (KR); Donghyun Kim, Seoul (KR); Changwoo Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 323 days.

(21) Appl. No.: 14/643,784

(22) Filed: Mar. 10, 2015

(65) Prior Publication Data

US 2015/0350392 A1    Dec. 3, 2015

(30) Foreign Application Priority Data

May 27, 2014 (KR) .................. 10-2014-0063423
May 27, 2014 (KR) .................. 10-2014-0063424
May 27, 2014 (KR) .................. 10-2014-0063425

(51) Int. Cl.
*F28F 27/00* (2006.01)
*H04M 1/02* (2006.01)
*H05K 7/20* (2006.01)
*G04G 21/00* (2010.01)

(52) U.S. Cl.
CPC .......... *H04M 1/0202* (2013.01); *G04G 21/00* (2013.01); *H05K 7/2039* (2013.01); *H05K 7/20336* (2013.01)

(58) Field of Classification Search
CPC . H04M 1/0202; G04G 21/00; H05K 7/20336; H05K 7/2039; F28D 2015/0216; F28D 2015/0225; F28D 15/0233; F28D 15/0241; F28D 15/0266
See application file for complete search history.

(56) References Cited

U.S. PATENT DOCUMENTS 5,560,423 A * 10/1996 Larson ................ F28D 15/0241
165/104.26
6,446,706 B1 * 9/2002 Rosenfeld ........... F28D 15/0241
165/104.26
6,772,445 B2 * 8/2004 Yeager ................ A44C 5/0023
2/170

(Continued)

FOREIGN PATENT DOCUMENTS

DE    202013007763 U1    10/2013

*Primary Examiner* — Travis Ruby
(74) *Attorney, Agent, or Firm* — Birch, Stewart, Kolasch & Birch, LLP

(57) ABSTRACT

A watch type mobile terminal includes a main body configured to include an electric apparatus unit in which an electronic part is mounted, a band configured to be worn on a wrist of a user in a manner of being combined with the main body, a heat pipe configured to include a first pipe positioned at the main body and a second pipe positioned at the band wherein the first pipe and the second pipe forms a loop in a manner of being connected with each other, a first working fluid injected into the heat pipe and a second working fluid different from the first working fluid in density. The watch type mobile terminal can emit heat of the main body at the band using the heat pipe.

11 Claims, 23 Drawing Sheets

(56) References Cited

U.S. PATENT DOCUMENTS

| | | | |
|---|---|---|---|
| 2009/0316359 A1* | 12/2009 | Blanco, Jr. | F28D 15/0275 |
| | | | 361/699 |
| 2010/0108296 A1 | 5/2010 | Moon et al. | |
| 2016/0132081 A1* | 5/2016 | Wu | G06F 1/203 |
| | | | 361/679.03 |
| 2016/0154441 A1* | 6/2016 | Shen | G06F 1/163 |
| | | | 361/679.03 |
| 2016/0154442 A1* | 6/2016 | Shen | G06F 1/203 |
| | | | 361/679.03 |
| 2016/0201994 A1* | 7/2016 | Shen | F28D 15/04 |
| | | | 165/104.26 |
| 2016/0341486 A1* | 11/2016 | Kim | F28D 15/02 |
| 2017/0017279 A1* | 1/2017 | Saeidi | G06F 1/206 |

* cited by examiner

FIG. 5
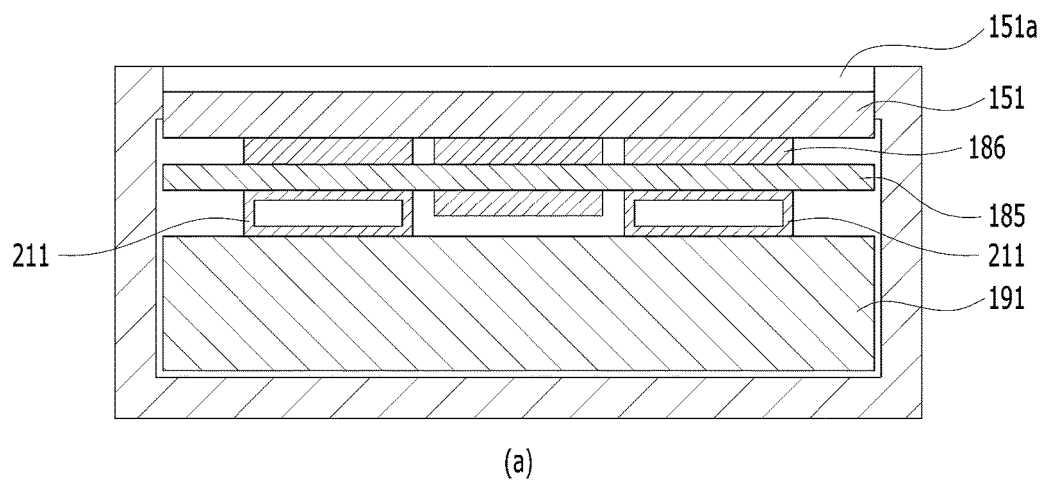
(a)
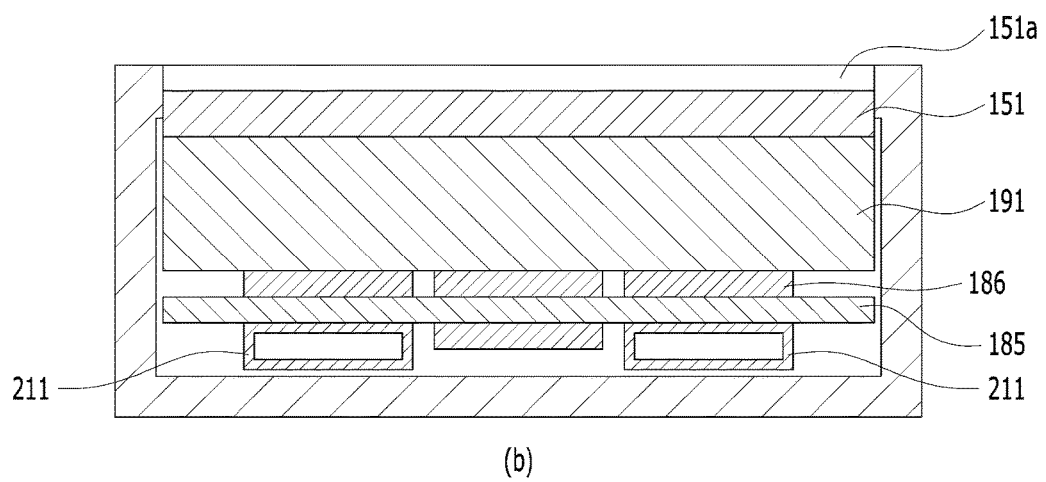
(b)

FIG. 6
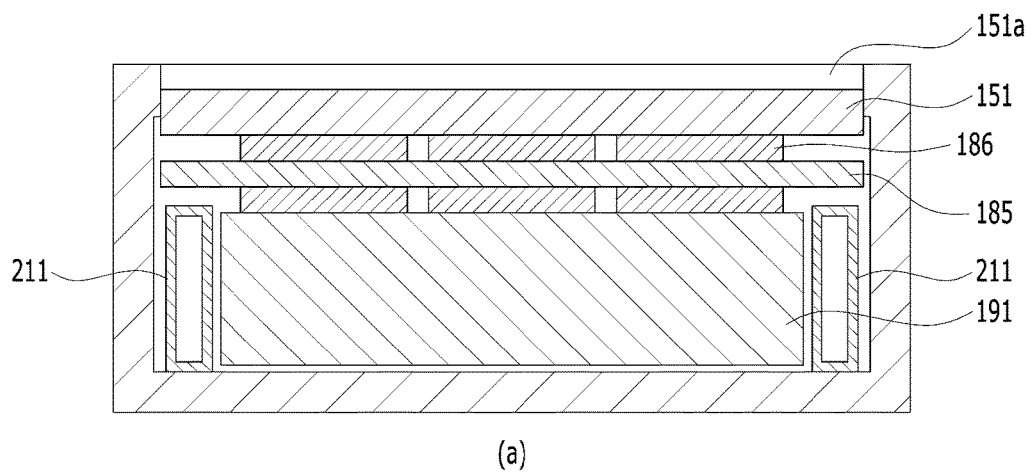
(a)
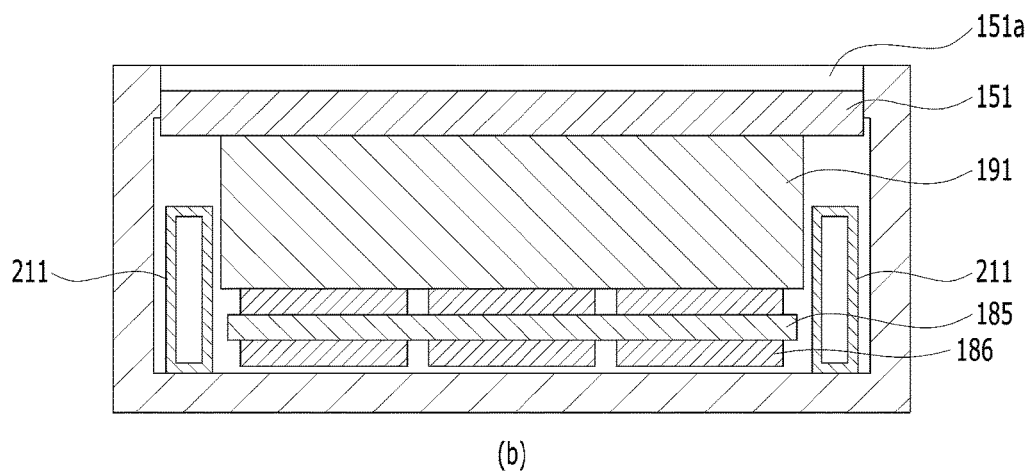
(b)

FIG. 7
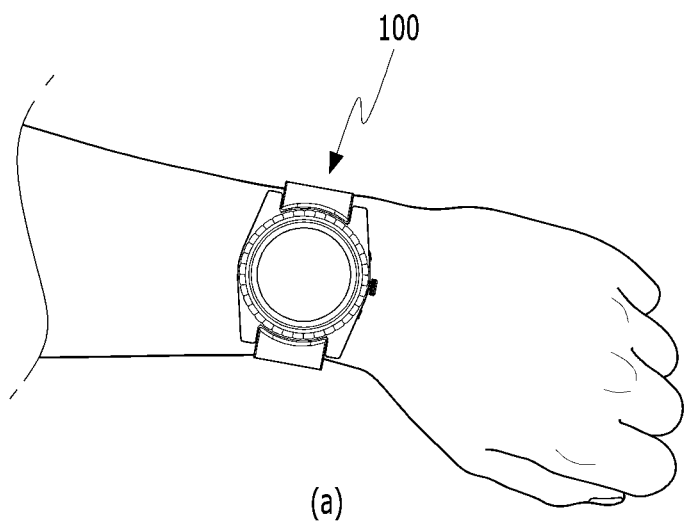
(a)
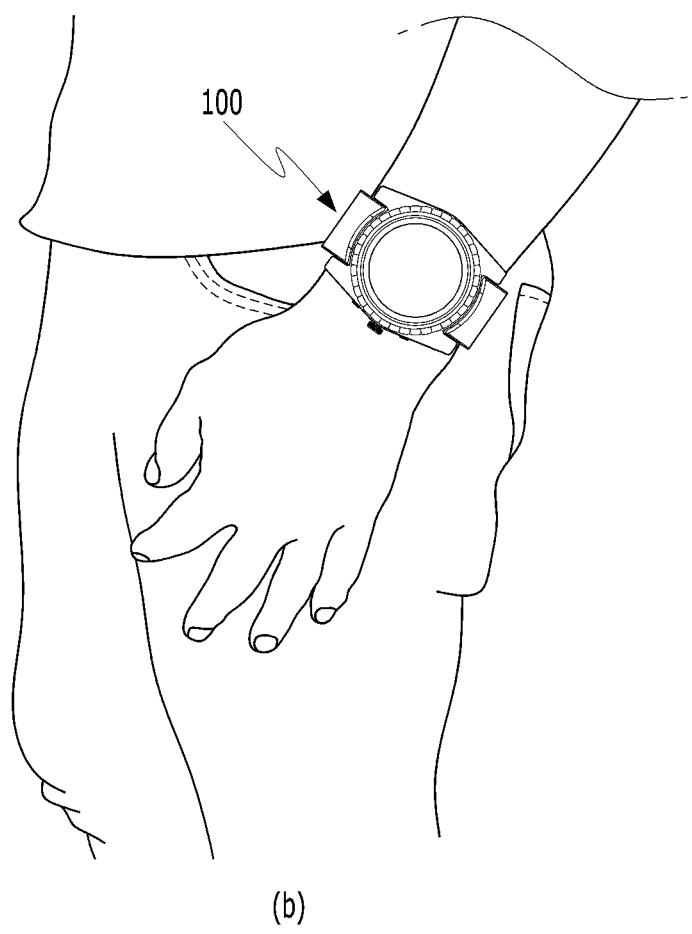
(b)

WATCH TYPE MOBILE TERMINAL

This application claims priority to Korean Patent Application No. 10-2014-0063423, No. 10-2014-0063424, No. 10-2014-0063425 filed on May 27, 2014 in Korea, the entire contents of which is hereby incorporated by reference in its entirety.

BACKGROUND OF THE INVENTION

Field of the Invention

The present invention relates to a watch type mobile terminal improving a heat emission function using a density difference of a fluid.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As functions of a terminal are diversifying, the terminal is implemented as a form of a multimedia player equipped with such complex functions as capturing a picture or a video, playing music or a video file, gaming, broadcast reception and the like.

Moreover, as a mobile terminal is considered as a personal belonging, various designs can be applied to the mobile terminal to express individuality of a user.

According to an organizational form of a conventional mobile terminal, the device is carried by a hand or is carried in a pocket in a manner of being manufactured by a size capable of being held by a hand. In the course of carrying the mobile terminal, the mobile terminal may have a chance to be damaged due to a loss or a drop of the mobile terminal.

In order to prevent the mobile terminal from being damaged, a wearable terminal of various forms capable of being worn on a wrist like a watch, being hanged on a necklace or being worn at a waist of a user is appearing. A size and a function of a wearable terminal may vary according to a wearing form. A wearable terminal of various forms can be utilized according to a necessity of a user.

Since a mobile terminal of watch type is directly contacted with a body of a user, in case of wearing the mobile terminal, displeasure can be reduced when heat of the mobile terminal is radiated. Yet, since a size of the mobile terminal of watch type is small, the mobile terminal has no space sufficient enough to install a heat emission structure in the mobile terminal. Hence, it is required to have a structure capable of increasing heat removal performance while volume of the structure is reduced.

SUMMARY OF THE INVENTION

An object of the present invention is to provide a watch type mobile terminal in consideration of a heat emission performance using a fluid without power To achieve these objects and other advantages and in accordance with the purpose of the invention, as embodied and broadly described herein, a watch type mobile terminal includes a main body configured to include an electric apparatus unit in which an electronic part is mounted, a band configured to be worn on a wrist of a user in a manner of being combined with the main body, a heat pipe configured to include a first pipe positioned at the main body and a second pipe positioned at the band wherein the first pipe and the second pipe forms a loop in a manner of being connected with each other, a first working fluid injected into the heat pipe and a second working fluid different from the first working fluid in density.

The first pipe can be arranged in the vicinity of a main board mounted on the main body.

The first pipe can be arranged according to outskirts of the main body.

Thickness of the first pipe can be formed as thinner than thickness of the second pipe.

The band can further include an insulator formed on a first side which is in contact with a body of the user.

The band can further include a heat radiating bump formed on a second side which is not in contact with a body of the user.

The second pipe can further include a velocity reducing bump formed on a surface of a side adjacent to a body of the user.

The watch type mobile terminal further includes a metallic ball positioned at the inside of the heat pipe, a density of the metallic ball can be formed as heavier than a density of the first working fluid and a density of the second working fluid.

The watch type mobile terminal further includes a heat absorption bar positioned at the inside of the heat pipe, a density of the heat absorption bar may correspond to a median value between a density of the first working fluid and a density of the second working fluid.

The heat pipe is formed by a transparent material, a position of the band corresponding to the heat pipe is transparent and the band can further include a powder or a piece inserted into the first working fluid or the second working fluid.

The watch type mobile terminal further includes a powder or a piece, the powder or the piece injected into the inside of the heat pipe, the powder or the piece similar to the first working fluid or the second working fluid in density, the powder or the piece of a high heat conductivity rate.

To achieve these objects and other advantages and in accordance with the purpose of the invention, as embodied and broadly described herein, a watch type mobile terminal includes a main body configured to include an electric apparatus unit in which an electronic part is mounted, a battery mounted on the electronic apparatus unit and a main board arranged in the vicinity of one side of the battery, wherein the battery includes a housing, a plurality of channel walls exposed to an internal wall of the housing and expanded in one direction, a battery cell positioned at the inside of the housing and an electrolyte injected into a plurality of channels, which are formed by the housing, the battery cell and the channel walls.

A height of the channel wall can be formed according to a separation distance between the battery cell and the internal wall of the housing.

The channel wall can form channels continuously formed on the top and the bottom in a manner of connecting channel walls formed on the top side and channel walls formed on the bottom side with each other.

The main board can further include a display unit positioned at one side of the main body and positioned at another side of the main body.

A space between channel walls formed on one side of the battery can be formed as narrower than a space between channel walls formed on another side of the battery.

A height of a channel wall formed on one side of the battery can be formed as lower than a height of a channel wall formed on another side of the battery.

A hydraulic diameter of each channel can be formed by a diameter between 500 μm and 1000 μm.

The electrolyte can be injected as much as 30% to 70% of a total volume of the channel.

To achieve these objects and other advantages and in accordance with the purpose of the invention, as embodied and broadly described herein, a watch type mobile terminal includes a main body configured to include an electric apparatus unit in which an electronic part is mounted, a main board positioned at the bottom of the main body and a cooling barrel formed on an outer circumstance of the main body. A longitudinal section of the cooling barrel includes an internal space of a donut shape.

The watch type mobile terminal further includes a shield can positioned at a top side. The shied can is able to be extended to the bottom of the cooling barrel.

The watch type mobile terminal can further include a TIP (thermal interface pad) positioned between the shield can and an IC formed on the main board.

The watch type mobile terminal can further include a plurality of heat radiation pins positioned at the top of the cooling barrel.

The cooling barrel can consist of a plurality of cells which are divided from each other.

The cooling barrel can include a side curved from the top to the bottom, which is positioned at an external of the cooling barrel.

The watch type mobile terminal can further include a working fluid injected into the cooling barrel.

The internal space of the donut shape includes a space of an inside direction of the main body smaller than a space of an outside direction of the main body.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

FIG. 5 is a diagram for a cross section of FIG. 3;

FIG. 6 is a diagram for a cross section of FIG. 4;

FIG. 7 is a diagram for a transformed example of a heat pipe of a watch type mobile terminal according to one embodiment of the present invention;

DETAILED DESCRIPTION OF THE INVENTION

Figure 1:
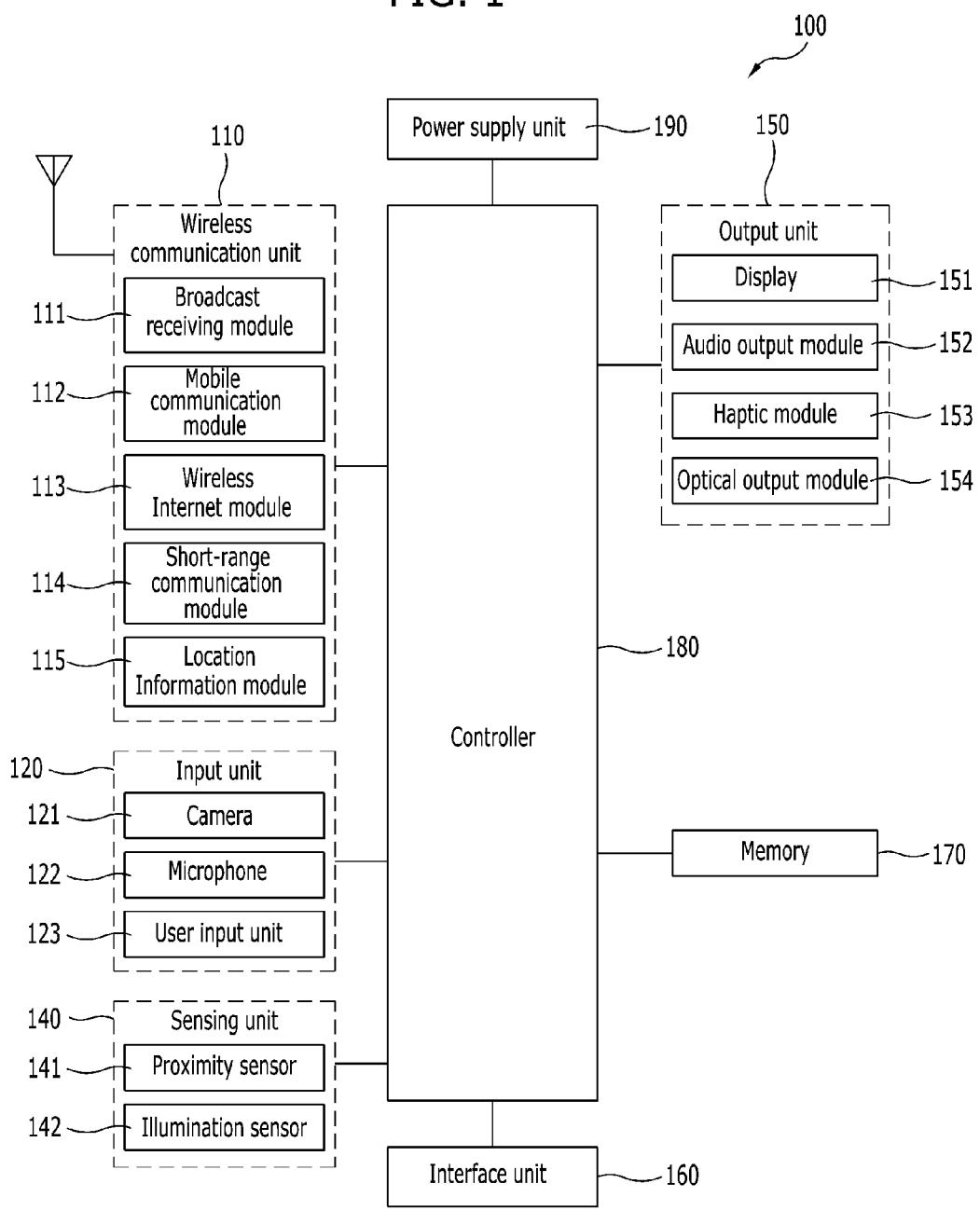
FIG. 1 is a block diagram for a watch type mobile terminal according to one embodiment of the present invention.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 2:
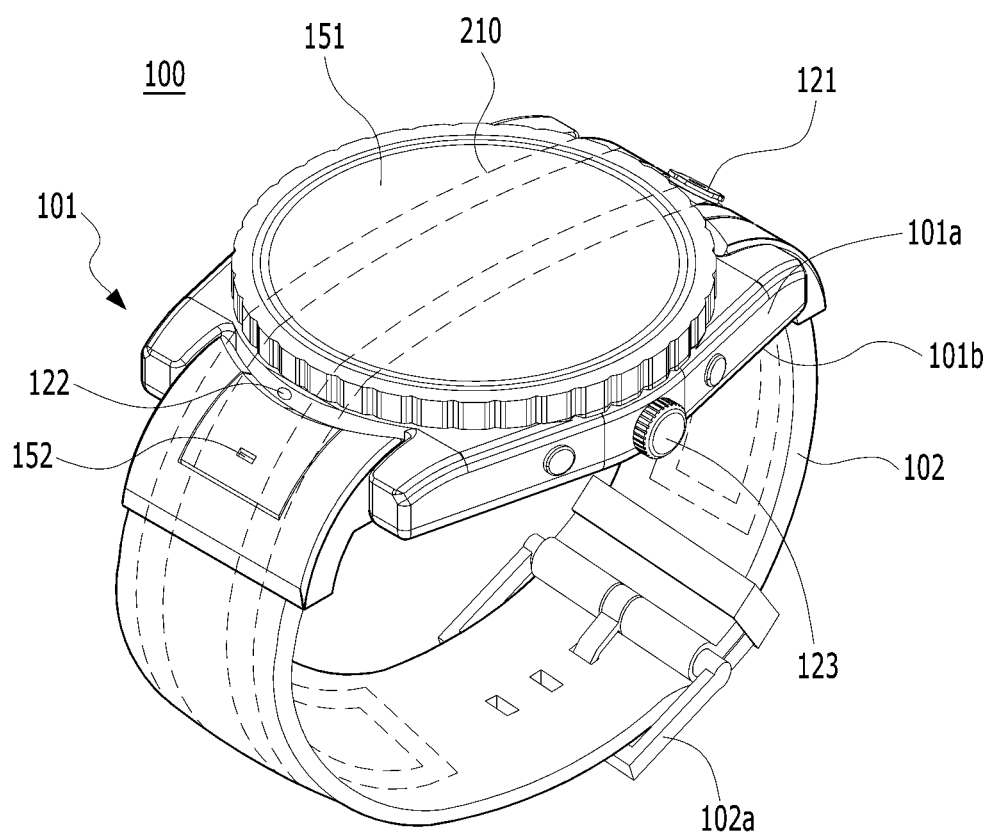
FIG. 2 is a front perspective diagram for a watch type mobile terminal according to one embodiment of the present invention.

Reference is now made to FIGS. 1 and 2, where FIG. 1 is a block diagram of a mobile terminal in accordance with the present disclosure, and FIG. 2 are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

FIG. 2 is a perspective view illustrating one example of a watch-type mobile terminal 100 in accordance with another exemplary embodiment.

Figure 3:
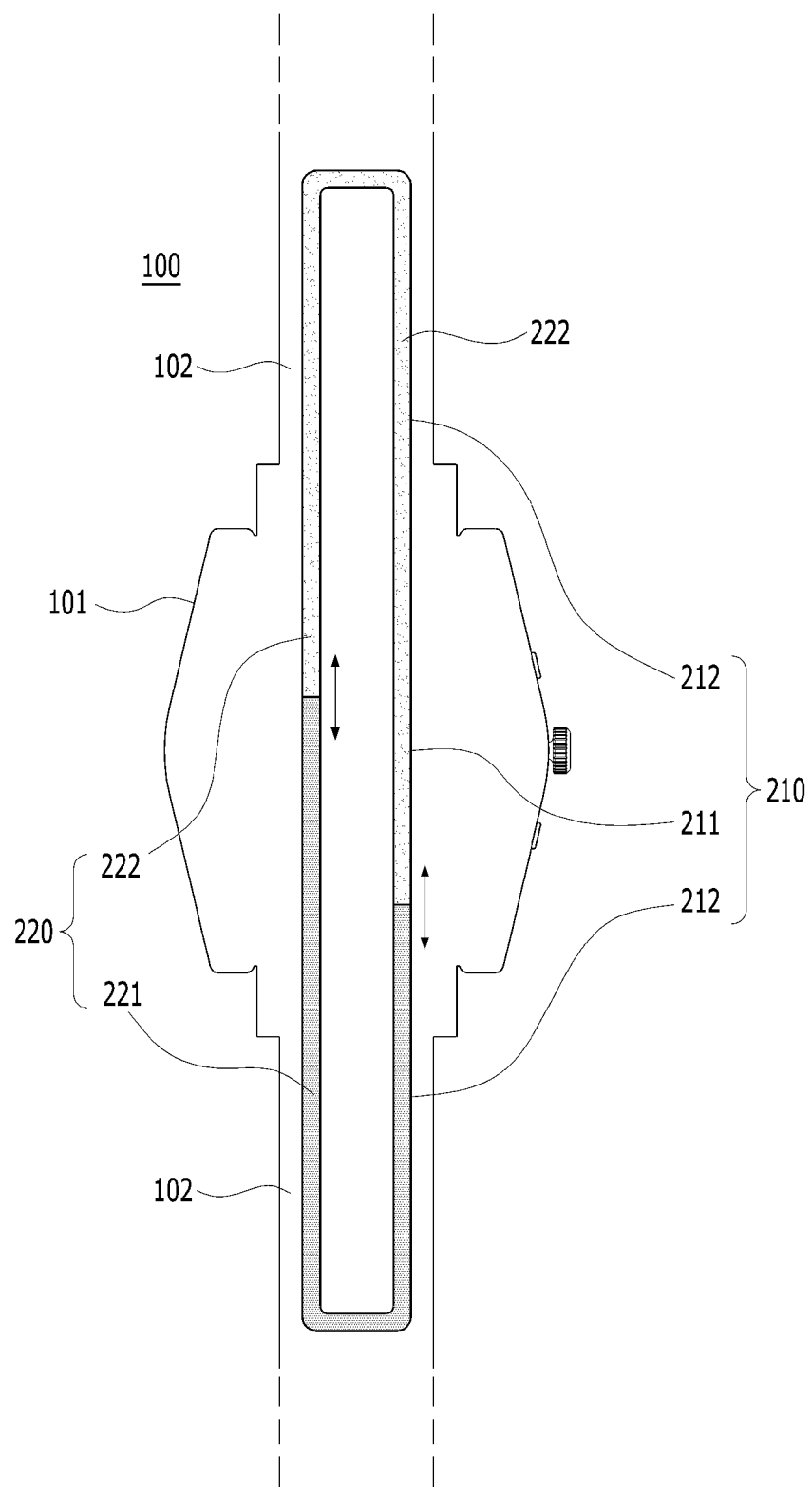
FIG. 3 is a diagram for a heat pipe of a watch type mobile terminal according to one embodiment of the present invention.

As illustrated in FIG. 3, the watch-type mobile terminal 300 includes a main body 301 with a display unit 351 and a band 302 connected to the main body 301 to be watch type on a wrist.

As illustrated in FIG. 2, the watch-type mobile terminal 100 includes a main body 101 with a display unit 151 and a band 102 connected to the main body 101 to be The main body 101 may include a case having a certain appearance.

As illustrated, the case may include a first case 101a and a second case 101b cooperatively defining an inner space for accommodating various electronic components. Other configurations are possible. For instance, a single case may alternatively be implemented, with such a case being configured to define the inner space, thereby implementing a watch type mobile terminal 100 with a uni-body.

The watch type mobile terminal 100 can perform wireless communication, and an antenna for the wireless communication can be installed in the main body 101. The antenna may extend its function using the case. For example, a case including a conductive material may be electrically connected to the antenna to extend a ground area or a radiation area.

The display unit 151 is shown located at the front side of the main body 101 so that displayed information is viewable to a user. In some embodiments, the display unit 151 includes a touch sensor so that the display unit can function as a touch screen. As illustrated, window 151a is positioned on the first case 101a to form a front surface of the terminal body together with the first case 101a.

The illustrated embodiment includes audio output module 152, a camera 121, a microphone 122, and a user input unit 123 positioned on the main body 101. When the display unit 151 is implemented as a touch screen, additional function keys may be minimized or eliminated. For example, when the touch screen is implemented, the user input unit 123 may be omitted.

The band 102 is commonly worn on the user's wrist and may be made of a flexible material for facilitating wearing of the device. As one example, the band 102 may be made of fur, rubber, silicon, synthetic resin, or the like. The band 102 may also be configured to be detachable from the main body 101. Accordingly, the band 102 may be replaceable with various types of bands according to a user's preference.

In one configuration, the band 102 may be used for extending the performance of the antenna. For example, the band may include therein a ground extending portion (not shown) electrically connected to the antenna to extend a ground area.

The band 102 may include fastener 102a. The fastener 102a may be implemented into a buckle type, a snap-fit hook structure, a Velcro® type, or the like, and include a flexible section or material. The drawing illustrates an example that the fastener 102a is implemented using a buckle.

When an electronic component mounted on a watch type mobile terminal is driving, the electronic component generates heat. In particular, in case of an IC module 186 in charge of control of a watch type mobile terminal 100, electronic circuits are concentrated on a small space. Hence, when the IC module is driving, the IC module emits heat.

The IC module 186 includes an AP (application process) chip driving an OS of a mobile terminal and various applications, a GPU (graphic processing unit) controlling an image outputted via a display unit 151, a power management chip and the like.

If heat is concentrated on a specific part, the IC module 186 can be damaged. In case of such a device directly contacted with a body of a user as a watch type mobile terminal 100, if heat is directly delivered to skin of the user, the user may be in danger of burn and the like. Hence, it is necessary to distribute the heat occurred in the IC module 186.

Figure 4:
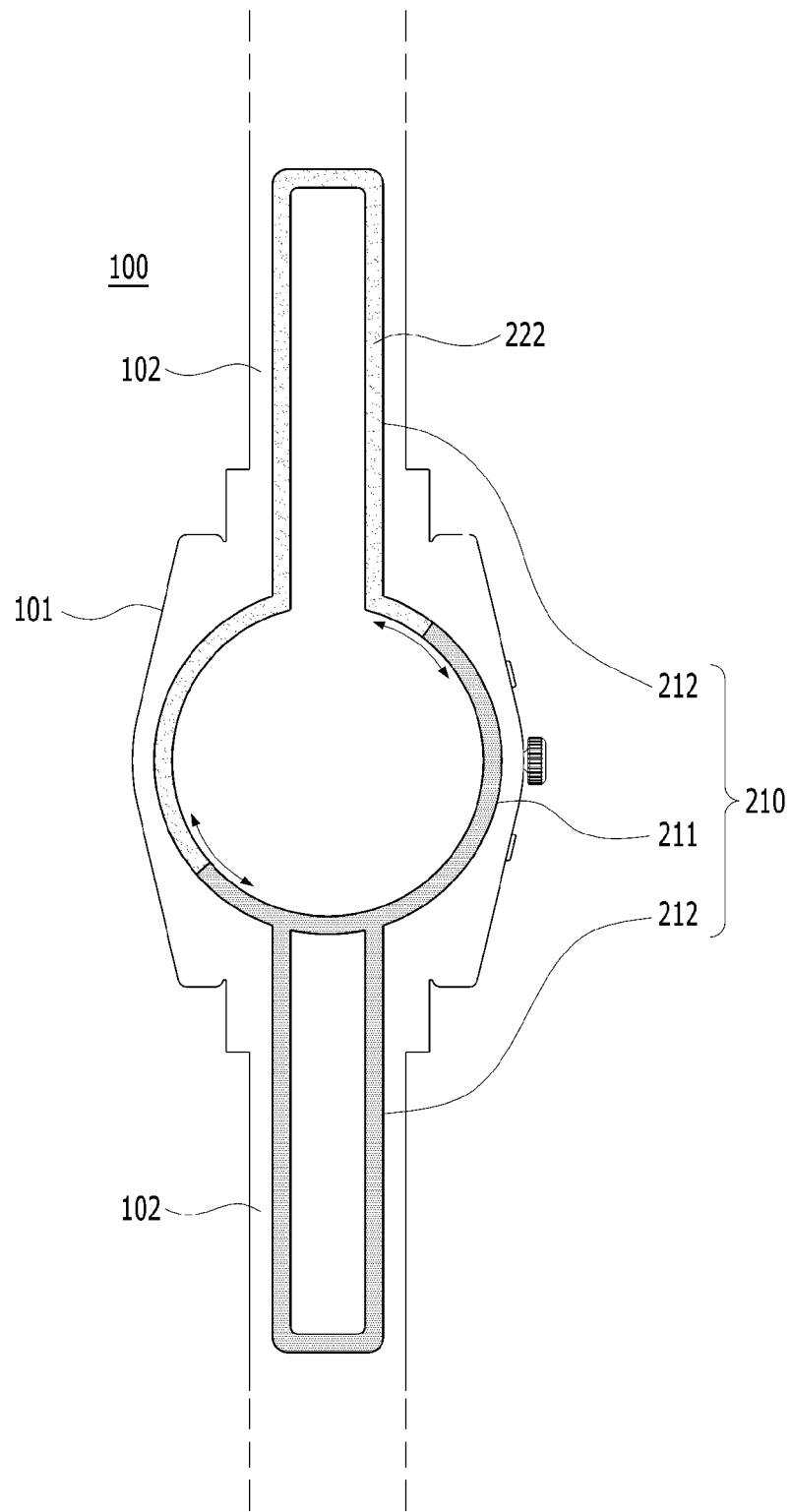
FIG. 4 is a diagram for a transformed example of a heat pipe of a watch type mobile terminal according to one embodiment of the present invention.

FIG. 3 and FIG. 4 are diagrams for a pipe of a watch type mobile terminal according to one embodiment of the present invention. The watch type mobile terminal according to the present invention includes a main body 101 and a heat pipe 210 penetrating a band 102. The heat pipe 210 includes a first pipe 211 positioned at the main body 101 and a second pipe 212 positioned at a band 102 part. The first pipe 211 and the second pipe 212 are connected with each other and form a single loop.

As shown in FIG. 3, although the first pipe 211 and the second pipe 212 are able to form a straight line in a manner that the heat pipe 210 penetrates the main body 101, as shown in FIG. 4, the heat pipe 210 can be positioned at outskirts of the main body 101 according to a shape of the main body 101.

FIG. 5 and FIG. 6 are diagrams for a cross section of the main body 101 shown in FIG. 3 and FIG. 4. As shown in FIG. 3, when the heat pipe 210 penetrates the main body 101, the heat pipe 210 can be arranged in the vicinity of a mainboard. As shown in FIG. 5 (a), the heat pipe 210 can be interposed between a battery and a mainboard. Or, as shown in FIG. 5 (b), the heat pipe 2210 can be arranged in a manner of being one-sided.

If the heat pipe 210 is arranged as shown in FIG. 3 and FIG. 5, since the heat pipe is adjacent to an IC module 186 corresponding to a heat emitting part, it is beneficial in terms of heat absorption. Yet, since a structure of the watch type mobile terminal 100 should be modified, it may bring a structural limitation as well. In order to solve the aforementioned problem, as shown in FIG. 4, if the heat pipe is arranged according to the outskirts of the main body 101, a change of a legacy structure can be minimized. Or, as shown in FIG. 6, the heat pipe 210 can be arranged at the side of the mainboard and the battery.

Although FIG. 4 to FIG. 6 shows embodiments that the heat pipe 210 forms a single loop, the heat pipe 210 can be partly divided into a plurality of pipes. As the number of pipes is increasing, an area of a surface is also widened. By doing so, heat transfer efficiency may increase as well.

A material of high heat conductivity can be used for the heat pipe 210. If a band 102 is flexible, a flexible resin can be used for a second pipe 212 part only. Yet, since the resin corresponds to a material of low heat conductivity, such a material of high heat conductivity as graphite and the like can be mixed with the resin. The second pipe 212 can be implemented by cutting a grove on the band 102 without inserting a separate tubular member into the band 102.

If a working fluid 220 is injected into the inside of the heat pipe 210, the working fluid 200 is moving around the heat pipe, absorbs heat in a first pipe 211 positioned at the main body 101 and emits heat in a second pipe 212 positioned at the band 102. The working fluid is a fluid of which heat conductivity is high. If ambient temperature is high, the working fluid absorbs heat well and if the ambient temperature is low, the working fluid emits heat so that the heat of the main body 101 is radiated from the band 102. By doing so, it may prevent the main body 101 from being overheated.

If the working fluid 220 absorbs heat, a volume of the working fluid expands and density of the working fluid becomes smaller. The working fluid 220 has a characteristic tend to move to an upper part of a working fluid 220 of low temperature. Hence, the working fluid 220 moves according to the heat pipe 210. Yet, if a single type of working fluid 220 is used only, since density of the working fluid is same, the working fluid may not move although a watch type mobile terminal 100 moves.

In order to secure liquidity of the working fluid 220 which is injected into the inside of the heat pipe 210 of the watch type mobile terminal, according to the present invention, a plurality of materials of different density (first working fluid 221 and a second working fluid 222, assume that density of the first working fluid 221 is smaller than density of the second working fluid 222) are injected into the inside of the heat pipe 210.

In case of a fixed heat pipe, if there exists a difference in density of a working fluid, the working fluid is not circulated at all. Yet, since a watch type mobile terminal 100 according to the present invention is worn on a body of a user, the working fluid is continuously moving and the working fluid is changing according to a direction of gravity of the watch type mobile terminal 100 due to the movement. If the watch type mobile terminal is moving, the second working fluid 222 of bigger density moves to the direction of gravity and the first working fluid 221 of smaller density moves to a direction opposite to the direction of gravity.

Figure 8:
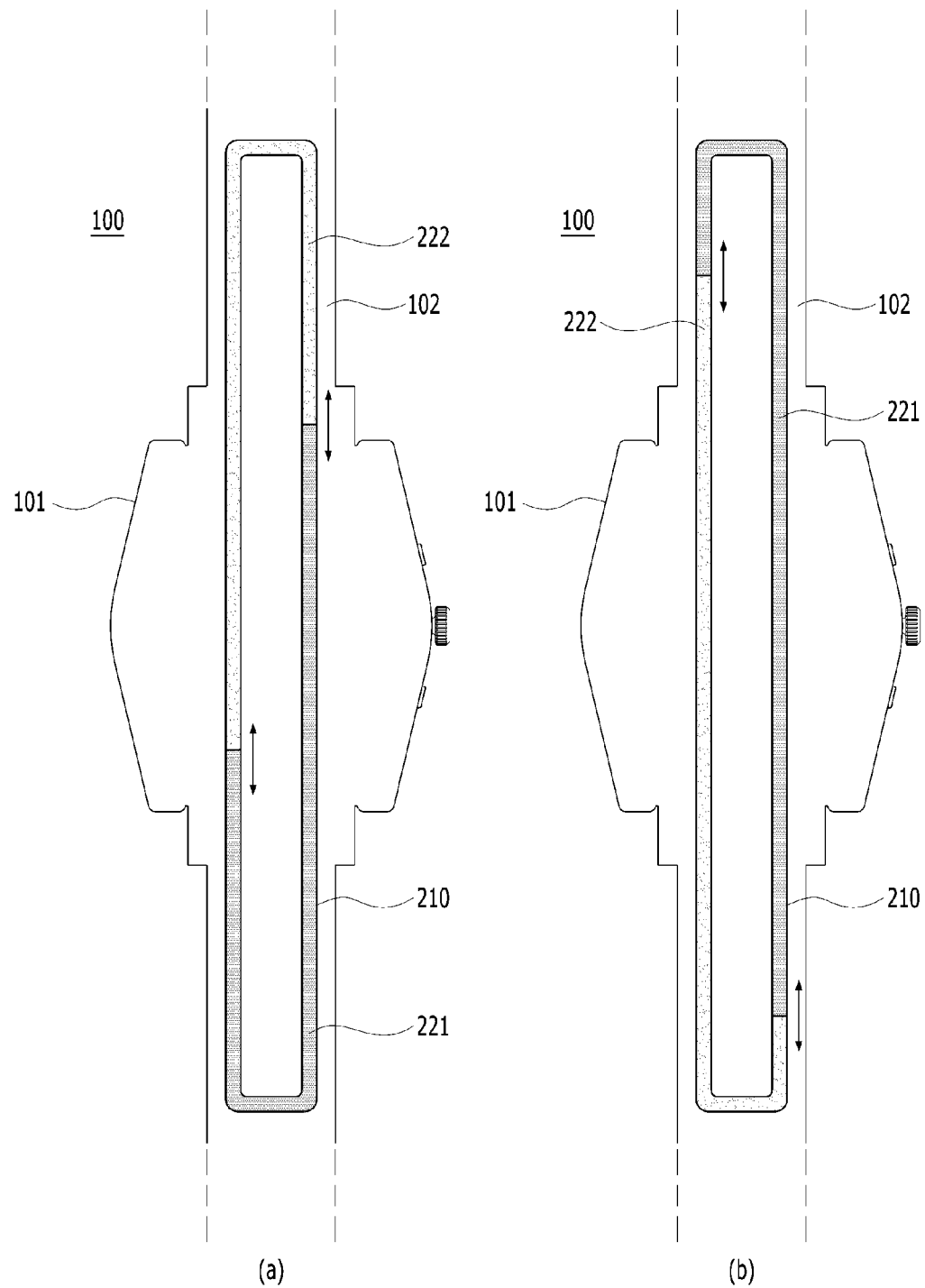
FIGS. 8 to 10 are diagrams for embodiments of a second pipe of a watch type mobile terminal according to one embodiment of the present invention.
Figure 9:
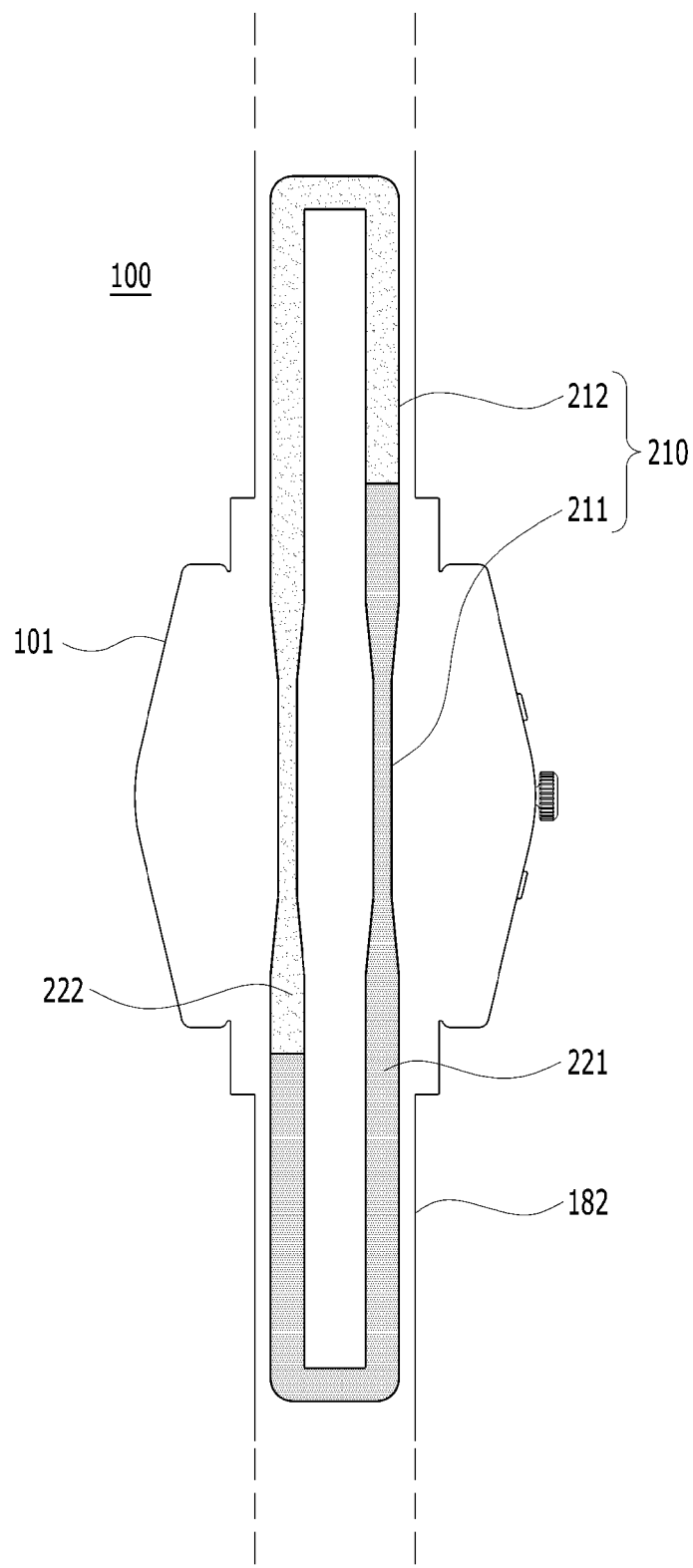

FIG. 7 and FIG. 8 are diagrams for explaining a position of a working fluid 220 according to a posture of a user wearing a watch type mobile terminal according to the present invention. In FIG. 7, if a down direction corresponds to a direction of gravity, FIG. 7 (a) shows that a bottom/right part of the watch type mobile terminal shown in FIG. 3 is positioned at the direction of gravity and FIG. 7 (b) shows that an upper/right part of the watch type mobile terminal shown in FIG. 3 is positioned at the direction of gravity.

Hence, in case of FIG. 7 (a), among a plurality of the working fluids 220 in the heat pipe 210, the second working fluid 222 of heavy density is positioned at the bottom/right as shown in FIG. 8 (a). On the contrary, in case of FIG. 7 (b), the second working fluid 222 of heavy density is positioned at the upper/left as shown in FIG. 8 (b).

FIG. 7 is a diagram for a transformed example of a heat pipe of a watch type mobile terminal according to one embodiment of the present invention. As shown in FIG. 7, a heat pipe 210 can be configured in a manner that thickness of a first pipe 211 and thickness of a second pipe 212 are different from each other. If a cross section area of the heat pipe 210 is small, a same amount of working fluid 220 moves fast to pass through the heat pipe. Hence, thermal diffusion efficiency can be increased by making a cross section area of the first pipe 211 smaller than a cross section area of the second pipe 212.

More specifically, a heat-absorbed working fluid 220 moves fast in the first pipe 211 of which the cross section area is small and a working fluid 220 of low temperature flows in the first pipe 211. Hence, a heat absorption efficiency may be enhanced. Since the working fluid 220 slowly moves in the second pipe 212 of which the cross section area is big, heat, which is absorbed in a heat carrier, can be sufficiently emitted in a band 102 part.

Figure 10:
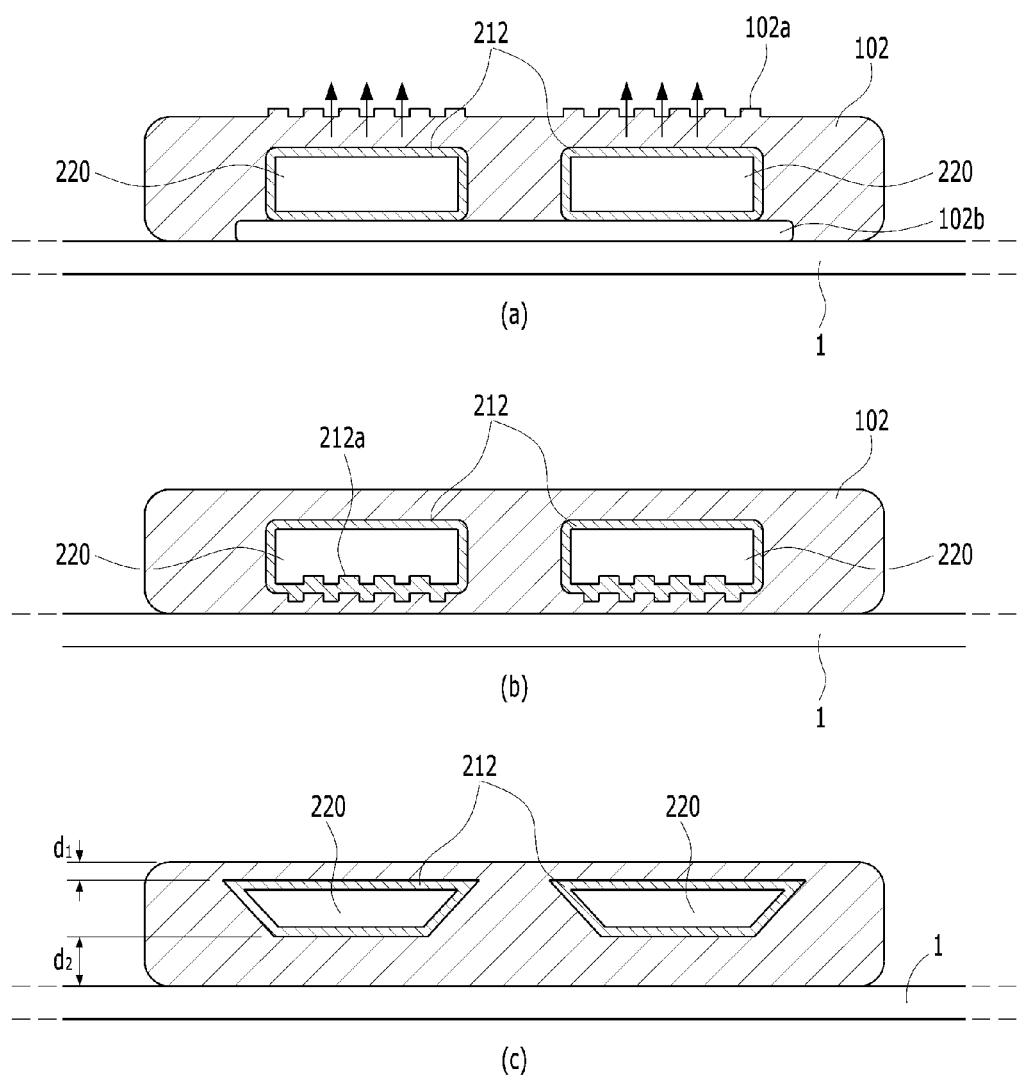

FIG. 10 is a diagram for embodiments of a pipe of a watch type mobile terminal 100 according to one embodiment of the present invention. It is preferable to implement an area of a surface as wide as possible in a second pipe 212 positioned at a band 102 part to emit heat.

As shown in FIG. 10 (a), a bump 102a can be formed on a part (hereinafter called a first side) not in contact with a body of a user to emit heat in a direction not in contact with the body of the user. A thermal insulator 102b is added to a part (hereinafter called a second side) in contact with the body of the user to minimize heat delivered to the body of the user.

Or, as shown in FIG. 10 (b), a velocity of a working fluid 220 can be reduced by forming a bump 212a in the inside of a second pipe 212 of a band 102 in a direction of the second side. If the velocity of the working fluid 220 of the second side direction is reduced compared to the velocity of the working fluid 220 of the first side direction due to a frictional force originated from the bump, heat of the main body 101 is absorbed and the hot working fluid 220 supplied from the first pipe 211 is supplied to the second pipe 212 in the first side direction. A temperature of the working fluid 220 of the first side direction is relative higher than a temperature of the working fluid 220 of the second side direction.

As shown in FIG. 10 (c), a shape of the second pipe 212 can be formed in a manner that a shape of the first side direction is wide and a shape of the second side direction is narrow. In this case, since an area of a surface of the second pipe 212 of the first side direction becomes widen, the first side direction may emit relatively more heat compared to the second side direction. Moreover, in order to make more heat emit in the first side direction, a position of the second pipe 212 can be arranged in a manner of being more adjacent to the first side direction (d1<d2).

Figure 11:
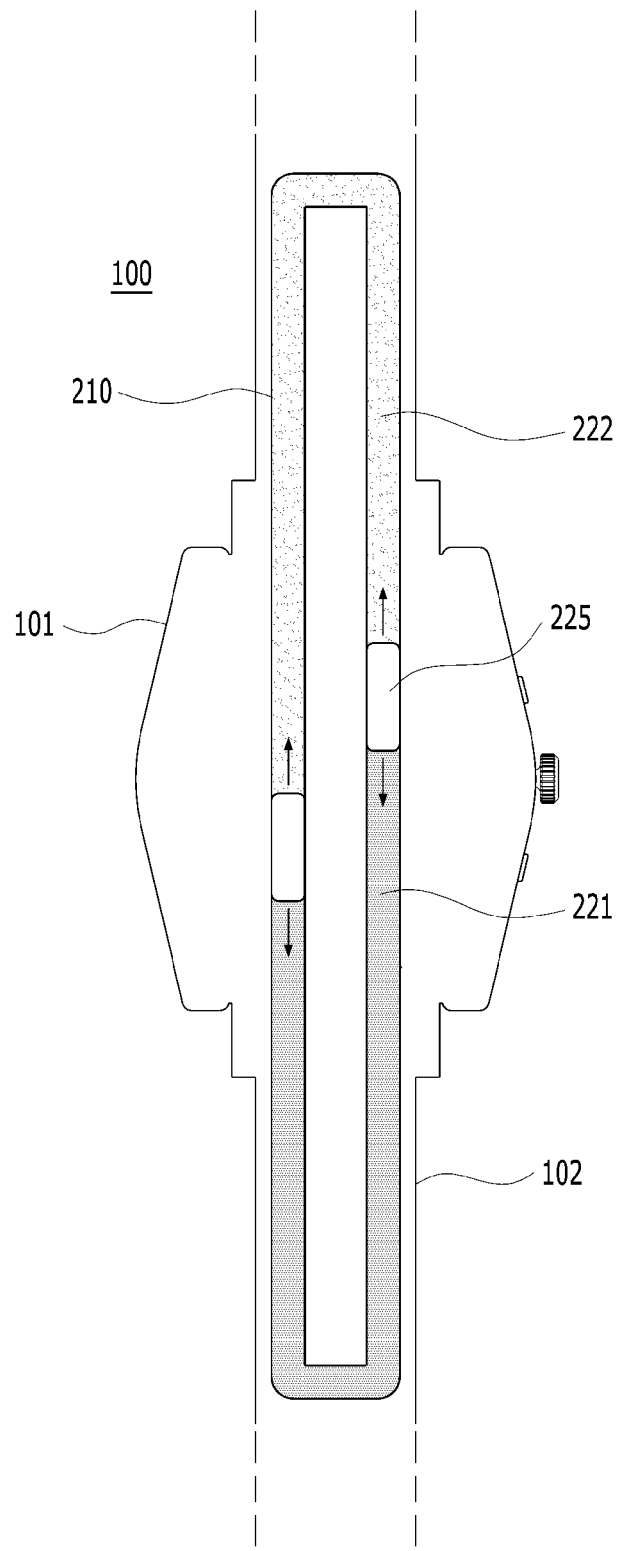
FIGS. 11 to 13 are diagrams for a transformed example of a heat pipe of a watch type mobile terminal according to one embodiment of the present invention.
Figure 12:
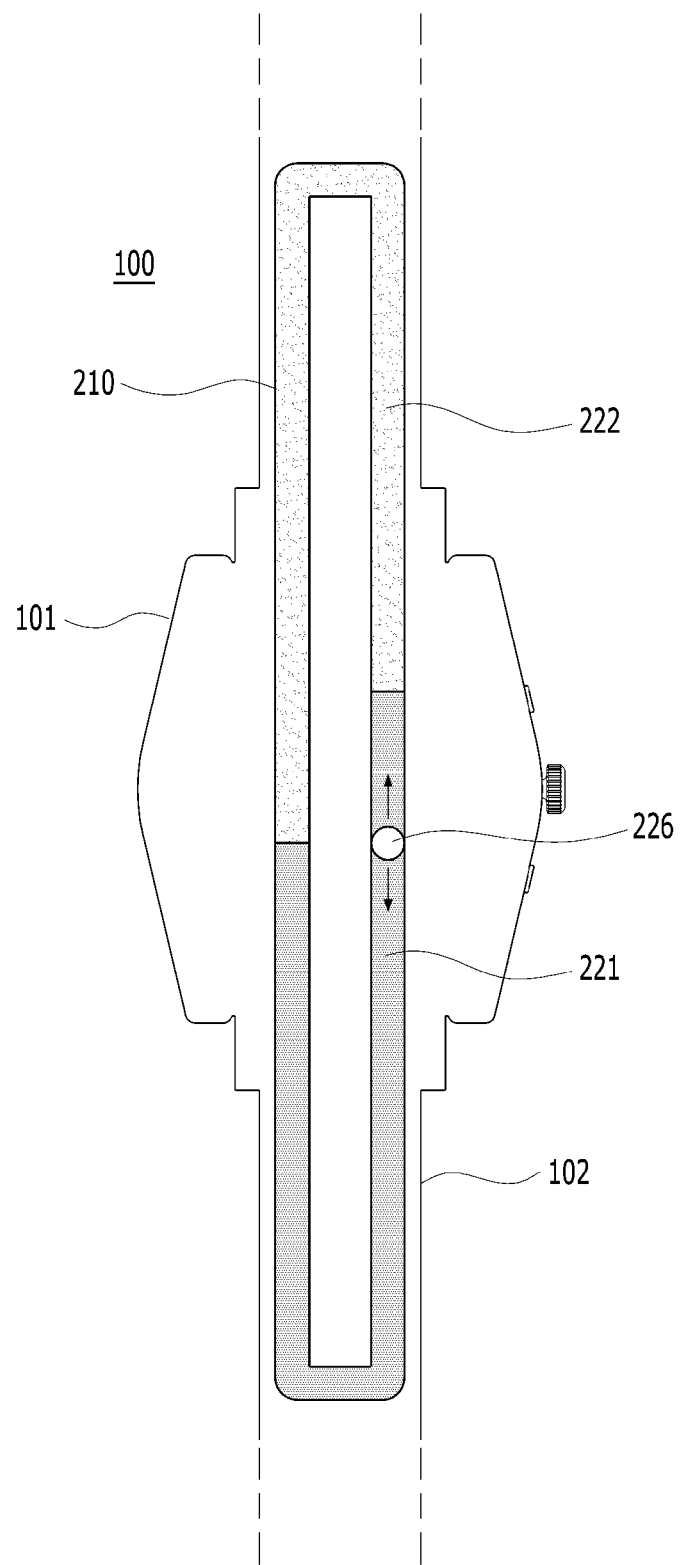
Figure 13:
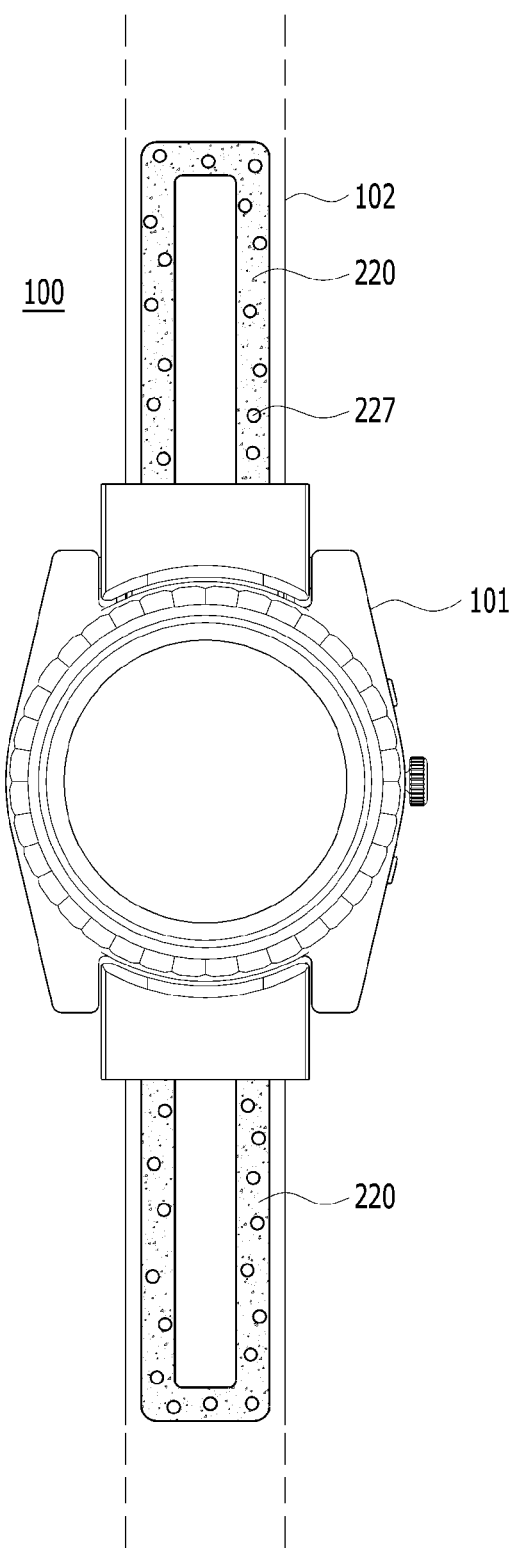

FIGS. 11 to 13 are diagrams for a transformed example of a heat pipe of a watch type mobile terminal according to one embodiment of the present invention. A heat absorption bar 255 including a density of a medium size between a density of a first working fluid 221 and a density of a second working fluid 222 can be further included in the inside of a heat pipe 210. The heat absorption bar 255 is a solid material of a high heat conductivity. The heat absorption bar 255 can absorbs ambient heat while moving between the first working fluid 221 and the second working fluid 222.

As shown in FIG. 11, a plurality of heat absorption bars 255 can be included in a boundary between the first working fluid 221 and the second working fluid 222 of both sides. Or, a single heat absorption bar can be included in the boundary between the first working fluid 221 and the second working fluid 222 of one side only.

Referring to FIG. 12, a metallic ball 226 of a density bigger than a density of the first working fluid 221 and a density of the second working fluid 222 can be included in the inside of the heat pipe 210. The metallic ball 226 moves in the heat pipe 210 according to a change of a direction of gravity. Since the density of the metallic ball is big, the metallic ball can come and go between the first working fluid 221 and the second working fluid 222. Due to the movement of the metallic ball, a movement of the first working fluid 221 and a movement of the second working fluid 222 can be activated. By doing so, thermal diffusion efficiency can be enhanced with the help of a convection current of the working fluid.

And, since a metallic ball 226 absorbs heat in a high temperature and emits heat in a low temperature, heat may be radiated by the metallic ball 226 as well.

Or, a second pipe 212 of a band 102 part and a second band 102 can be made up of a transparent material to see the inside of a heat pipe 210. A powder 227 or a piece including such an image as character and the like can be injected into a working fluid 220 in the inside of the heat pipe 210. When a density of the powder or the piece is similar to a density of the working fluid 220 or is little bit bigger than the density of the working fluid, if a state of being inclined to a specific direction is maintained, the powder or the piece moves to a direction of gravity. Yet, the direction of gravity of a watch type mobile terminal changes in a short time period, it may seem like the powder 227 or the piece is floating in the working fluid 220.

Since an effect of snowing, an effect of flying flower petals or an effect of a moving character can be shown using the powder 227 or the piece, design quality of a watch type mobile terminal can be enhanced.

Figure 14:
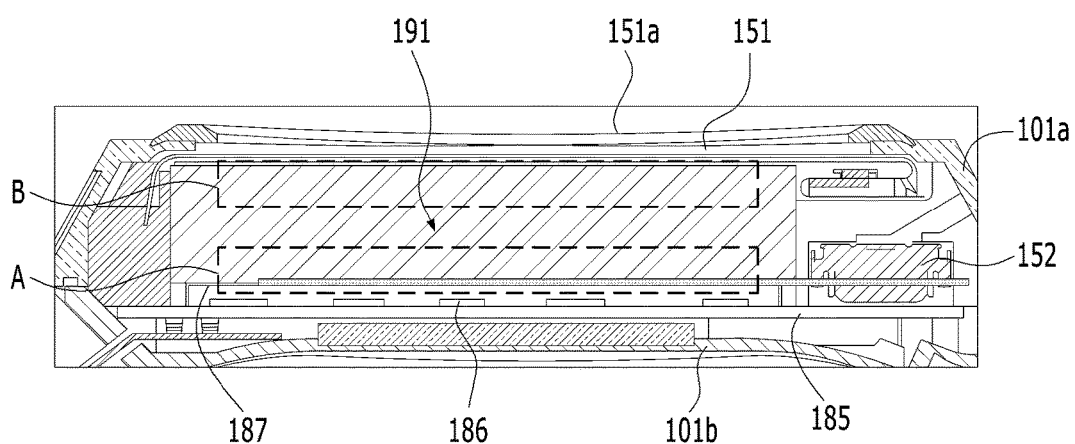
FIG. 14 is a diagram for a cross section of a watch type mobile terminal according to one embodiment of the present invention.

FIG. 14 is a diagram for a cross section of a watch type mobile terminal according to one embodiment of the present invention. A display unit 151 is positioned at the top of the drawing and a bottom part becomes a bottom side in contact with a body of a user. A battery 191, a main board 185 and an audio output unit 153 and the like are arranged in the inside of a case 101*a*/101*b*.

The battery 191 of the watch type mobile terminal uses a chargeable secondary cell for a long period usage.

The secondary cell charges electricity, which is generated in the course of triggering oxidation-reduction reaction of a material between anode and cathode triggered by electric current supplied by an external power source. Inversely, the secondary cell discharges electricity in a manner of converting chemical energy into electrical energy to supply power. It is able to repeatedly use the secondary cell. Main components of the secondary cell include a separation membrane, anode, cathode and electrolyte. Examples of the secondary cell include a nickel battery, an ion battery, a lithium ion battery, a polymer battery and the like according to a filling material of the secondary cell.

Among the secondary cells, a lithium ion battery using lithium, which is the lightest metal, is explained for example. A lithium-manganese oxide is used for a (+) electrode and a carbon is used for a (−) electrode and an electrolyte (lithium salt solution) in which lithium salt is melted to facilitate lithium-ion is filled between the two electrodes. The electrolyte plays a role of a medium of moving an electron between the two electrodes. The two electrodes can store lithium-ion in an atomic grid structure, respectively.

Figure 15:
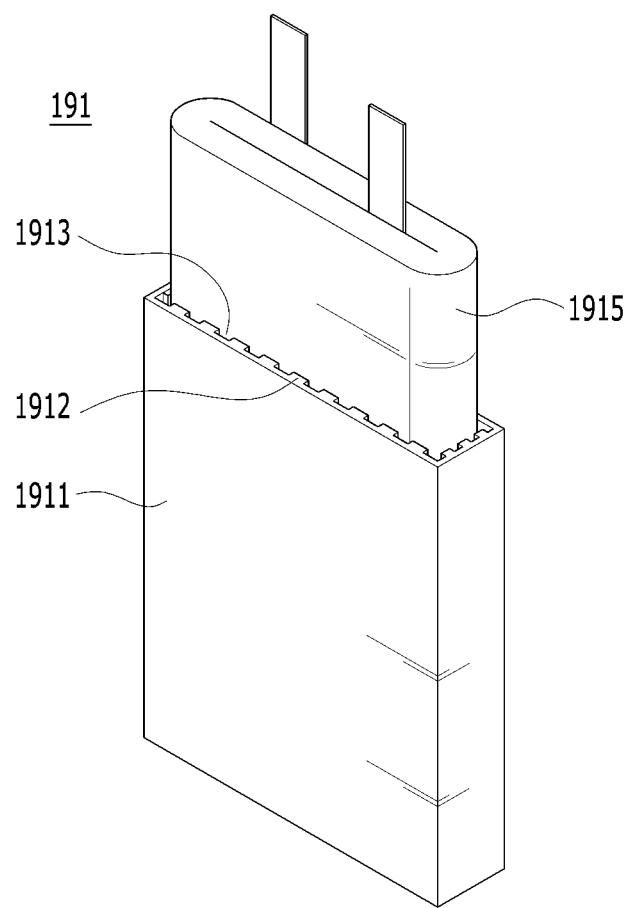
FIG. 15 is a disassembled perspective diagram for a battery structure of a watch type mobile terminal according to one embodiment of the present invention.

FIG. 15 is a disassembled perspective diagram for a battery 191 structure of a watch type mobile terminal 100 according to one embodiment of the present invention. Main components of the battery 191 include a battery cell 1915 consisting of a (+) electrode and a (−) electrode of the battery 191 and an electrolyte used for moving ion between the electrodes. In order to house the electrolyte and the battery cell 1915, the battery 191 is equipped with a housing 1911. Since the housing 1911 is bigger than the battery cell 1915, the electrolyte is injected into a separation space between the battery cell 1915 and the housing 1911.

Various electronic parts including an IC module 186 are mounted on a main board 185. In particular, the IC module 186 is in charge of a control of the watch type mobile terminal 100. The IC module 186 includes an AP (application process) chip driving an OS of a mobile terminal and various applications, a GPU (graphic processing unit) controlling an image outputted via a display unit 151, a power management chip and the like.

Since the IC module 186 is equipped with electronic circuits concentrated on a small space, the IC module corresponds to a representative heat emitting part generating heat when driving. If heat is concentrated on a specific part, the IC module 186 can be damaged. In case of such a device directly contacted with a body of a user as a watch type mobile terminal 100, if heat is directly delivered to skin of the user, the user may be in danger of burn and the like. Hence, it is necessary to distribute the heat occurred in the IC module 186.

Hence, a heat radiation structure is added to the battery 191 to absorb heat of a main board 185 positioned in the vicinity of one side (A) and radiate the heat from another side of the battery 191. When the radiation structure is added to the battery 191, the heat can be distributed using a convection phenomenon of an electrolyte without using a separate heat sink and a working fluid.

Figure 16:
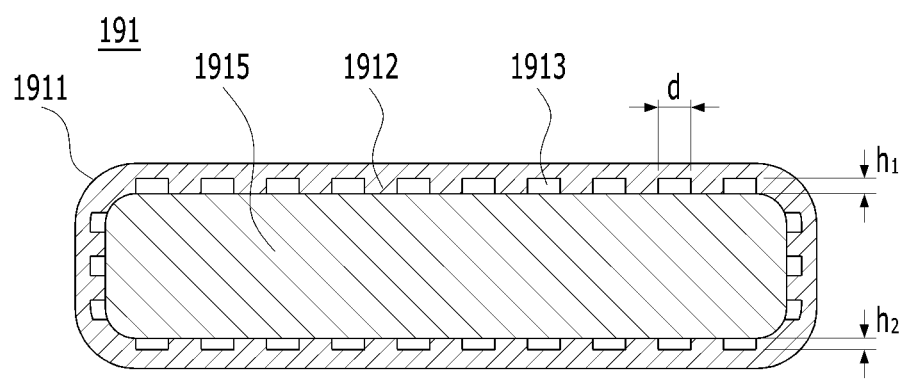
FIG. 16 is a diagram for a cross section of a battery of a watch type mobile terminal according to one embodiment of the present invention.

Referring to FIG. 15 and FIG. 16 showing a battery of a watch type mobile terminal according to one embodiment of the present invention, the battery 191 according to the present invention additionally includes a channel 1913 as well as the structure consisting of the housing 1911, the battery cell 1915 and the electrolyte. According to the present invention, heat occurred in a main board 185 can be diffused using a convection phenomenon, which is observed while the electrolyte injected between the housing 1911 and the battery cell 1915 is moving around according to the channel 1913.

FIG. 16 is diagram for a cross section of the battery 191 of the watch type mobile terminal according to one embodiment of the present invention. As shown in FIG. 16, the battery includes a plurality of channel walls 1912 extended in one direction from an inner wall of the housing 1911. A space consisting of the channel walls 1912, the housing 1911 and the battery cell 1915 becomes a channel 1913.

Hence, a height h1/h2 of the channel wall 1912 corresponds to a separation space between the housing and the battery cell. Since the battery cell 1915 forms one side of the channel 1913, an electrolyte may trigger an oxidation-reduction reaction in a manner of being in contact with the battery cell 1915 and circulate according to the channel 1913 due to a temperature difference in the watch type mobile terminal 100.

The channel wall 1912 can be continuously formed to be connected with one side and another side of the housing 1911, the electrolyte absorbs and radiates heat in a manner of moving around in one side and another side of the battery 191 according to the channel 1913 and the heat can be diffused by convection.

If a size of the channel 1913 is big, a moving speed of the electrolyte becomes slow. If the size of the channel 1913 is small, the moving speed of the electrolyte becomes fast. Hence, the moving speed of the electrolyte flowing in the channel 1913 is determined by a size of a hydraulic diameter of the channel 1913 formed by the channel wall 1912, the housing 1911 and the battery cell 1915.

The hydraulic diameter (D) is a value converted into a diameter of the channel 1913 of a circular form to compare an area of the channel 1913 of a quadrangular form with each other. The hydraulic diameter corresponds to a value resulted from dividing double of lengths of two sides multiplied by 2 by sum of the lengths of the two sides (D=2 (h*D)/(h+d)). A size of the hydraulic diameter may be determined by a size of between 500 μm and 100 μm. Yet, the size of the hydraulic diameter may vary according to such a characteristic as a boiling point of the electrolyte, a viscosity of the electrolyte and the like.

As a size of a cross section of the channel 1913 is small, a moving speed of the electrolyte is fast and ambient heat can be easily absorbed. As the size of the cross section of the channel 1913 is big, the moving speed of the electrolyte is slow and it is able to secure time for radiating energy stored in the electrolyte to around the channel.

Hence, a size of the channel 1913 of one side (A) adjacent to a main board can be made to be small to easily absorb heat and a size of the channel 1913 of another side (B) separated from the main board can be made to be big to efficiently radiate heat. By doing so, it may increase an absorption rate of the heat occurred in the main board 185 and increase a radiation rate of the heat in a position separated from the main board 185. As shown in FIG. 16, the size of the channel 1913 can be differently configured in a manner of adjusting a space (d) between channel walls 1912 or differentiating heights (h1>h2) of the channel walls 1912.

Since a watch type mobile terminal 100 is moving while being worn on a user, a gravity direction is not constant and may vary. On the contrary, when a user is using the watch type mobile terminal, since the user operates the watch type mobile terminal while directly watching a display unit 151, an arrangement of the watch type mobile terminal 100 is maintained in a state that the display unit 151 is arranged to face the upper part. Since an IC module 186 generates more heat when the user operates the watch type mobile terminal compared to a standby state, a great amount of heat is generated when the watch type mobile terminal is in use. Hence, a radiation performance is most important.

Hence, as shown in FIG. 14, in a structure of the case that the battery 191 is arranged to one side at which the display unit 151 is positioned and the main board 185 is arranged to another side, an electrolyte positioned at one side (A) of the battery 191 absorbs heat of the main board 185. Since the electrolyte, which have absorbed the heat, has small density, the electrolyte moves to an upper part and may be able to radiate the heat at another side (B) of the battery 191.

Figure 17:
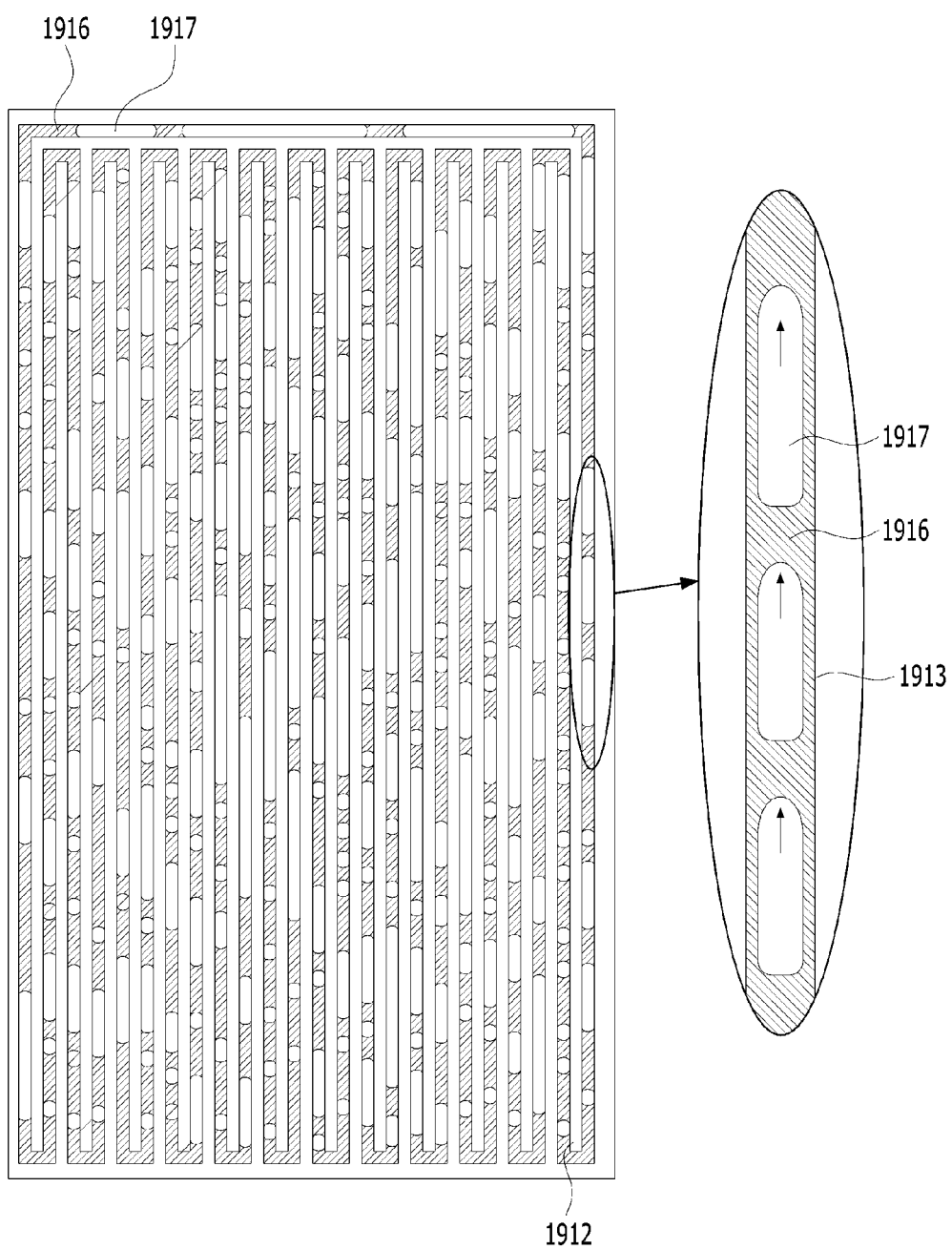
FIG. 17 is a diagram for channels formed in a battery of a watch type mobile terminal according to one embodiment of the present invention.

FIG. 17 is a diagram for channels 1913 formed in a battery 191 of a watch type mobile terminal 100 according to one embodiment of the present invention. An electrolyte 1916 injected into a channel 1913 absorbs heat and the electrolyte can be partly vaporized. The vaporized electrolytic steam 1917 moves in a direction opposite to a gravity direction due to a weigh difference with the electrolyte 1916 and the electrolyte 1916 is pushed in the gravity direction.

Since a watch type mobile terminal 100 moves in a state of being worn on a user, the gravity direction may change. Hence, whenever the user moves while wearing the watch type mobile terminal, the electrolytic steam 1917 and the electrolyte also move and heat can be diffused.

And, when a user uses the watch type mobile terminal while watching a display unit 151, another side of a main body 101 at which the display unit 151 is positioned faces an upper part and one side of the main body at which a main board 185 is positioned faces a bottom part, the electrolyte 1916, which have absorbed heat from the main board 185, is vaporized and moves to another side of the battery 191.

Since the electrolyte absorbs heat in the main board 185 and is vaporized, a channel 1913 of one side of the battery 191 which is adjacent to the main board 185 is called an evaporator. Since the electrolyte 1916 is liquefied in a channel 1913 of another side of the battery 191, it may be called a condenser. And, a place between the evaporator and the condenser can be called a bubble/slug oscillator.

The electrolyte 1916 changes to a gaseous state in a manner of absorbing heat in the evaporator (A), moves to the condenser (C) while making a phase change in the bubble/slug oscillator and radiates heat in the condenser (C) and makes a phase change again to a liquid state.

As mentioned in the foregoing description, in order for the electrolyte to make a phase change and to be vaporized, there should exist a spare space in the channel 1913. Hence, if the electrolyte 1916 is injected into the channel as much as 30% to 70% of a total volume of the channel 1913 and the channel is maintained in a vacuum state, a boiling point of the electrolyte is lowered compared to the boiling point of the electrolyte under air pressure. By doing so, an amount of vaporizing the electrolyte may increase. As vaporizing and liquefying are actively occurred, a heat transfer rate of a watch type mobile terminal can be improved.

Figure 18:
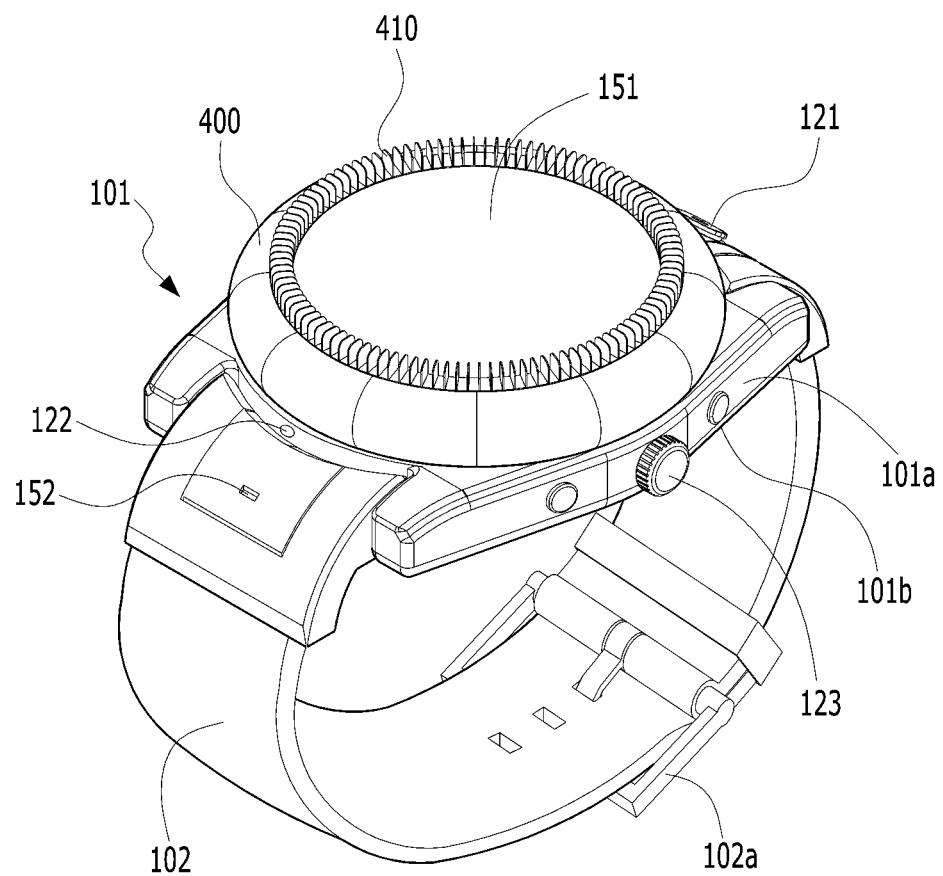
FIG. 18 is a front perspective diagram for a watch type mobile terminal according to one embodiment of the present invention.

FIG. 18 is a perspective diagram for a different example of a watch type mobile terminal 100 according to a different embodiment of the present invention. According to the present embodiment, the watch type mobile terminal includes a cooling barrel 400 which is formed on a circumstance of a main body 101. The cooling barrel 400 delivers heat of one side to another side via a flow path formed inside of the cooling barrel and may be able to radiate the heat at the another side.

Figure 19:
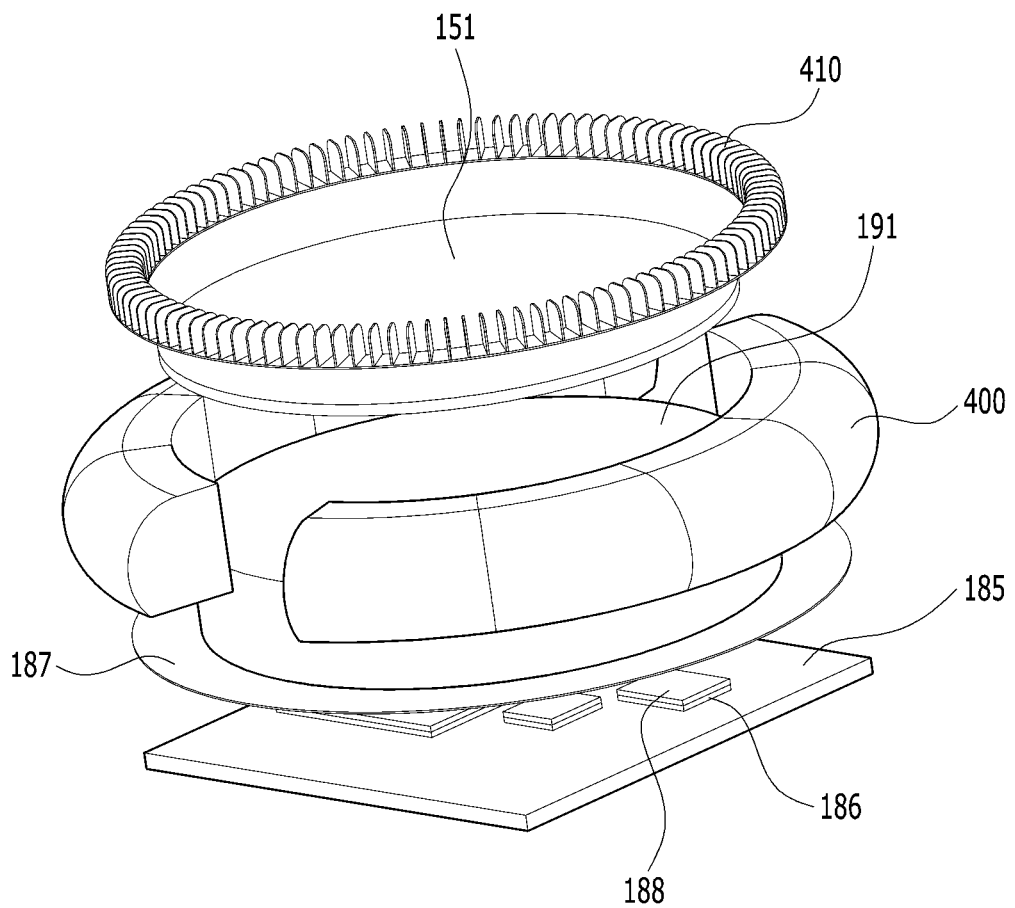
FIG. 19 is a disassembled perspective diagram for a watch type mobile terminal according to one embodiment of the present invention.
Figure 20:
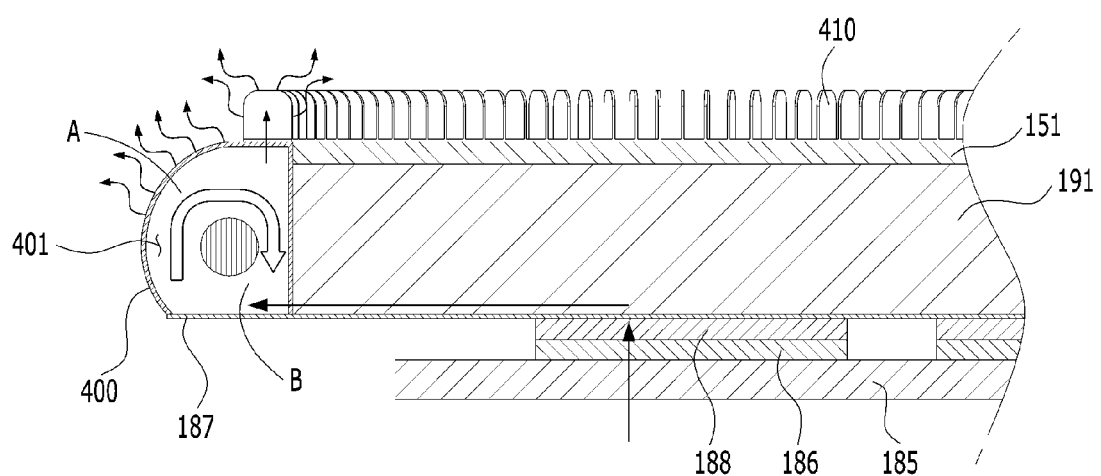
FIG. 20 is a diagram for a cross section of a watch type mobile terminal according to one embodiment of the present invention.

FIG. 19 is a disassembled perspective diagram for a watch type mobile terminal 100 according to one embodiment of the present invention and FIG. 20 is a diagram for a cross section of a watch type mobile terminal 100 according to one embodiment of the present invention. FIG. 19 and FIG. 20 show a cooling barrel 400 positioned at outskirts, a battery 191 positioned at the inside of the cooling barrel 400, a display unit 151 positioned at the top of the battery 191, a shield can 187 and a main board 185 positioned at the bottom of the battery 191.

Various electronic parts including an IC module 186 are mounted on the main board 185. In particular, the IC module 186 is in charge of a control of the watch type mobile terminal 100. Since the IC module 186 is equipped with electronic circuits concentrated on a small space, the IC module corresponds to a representative heat emitting part generating heat when driving.

If heat is concentrated on a specific part, the IC module 186 can be damaged. In case of such a device directly contacted with a body of a user as a watch type mobile terminal 100, if heat is directly delivered to skin of the user, the user may be in danger of burn and the like. Hence, it is necessary to distribute the heat generated by the IC module 186.

Hence, according to the present invention, the heat generated by the IC module 186 can be radiated in a manner of putting the cooling barrel 400 on the outskirts circumstance of the watch type mobile terminal 100. As shown in a longitudinal section of FIG. 20, since an internal space 401 of the cooling barrel 400 is made up of a donut shape, an internal fluid of the cooling barrel 400 can circulate up and down while moving according to the donut shape of the internal space 401.

If the internal space 401 of the cooling barrel 400 is maintained as an empty space, heat can be radiated by convection of air. If a cooling fluid is injected into the internal space 401 of the cooling barrel 400, heat can be radiated by convection of the cooling fluid.

It may use a heat delivery sheet to make heat occurred at the top of the main board 185 to be delivered to the cooling barrel 400. Yet, if a member is added, cost and volume are also increased. Hence, addiction of a part can be minimized in a manner of utilizing a shield can 187 positioned at the top of the main board 185 as a heat delivery medium.

The shield can 187 includes an upper board positioned at an upper side of the main board 185 and a sidewall to form a space separated from the main board 185. An IC module 186 and the like can be positioned at the space formed by the sidewall and the upper board. The shield can 187 provides a surface capable of protecting the IC module 186 and the surface capable of safely putting a different part (in the present embodiment, a battery) on the upper board of the main board 185.

If the shield can 187 is configured by a metal of a high heat conductivity rate, heat generated by the IC module 186 can move according to the shied can 187. As shown in FIG. 20, the heat of the IC module 186 can be delivered to the cooling barrel 400 in a manner of extending the shied can 187 to the bottom part of the cooling barrel 400.

Since the IC module 186 and the shield can 187 are separated from each other by a space, the heat generated by the IC module should be delivered to the shield can 187 by a radiation scheme. If the shield can 187 is directly in contact with the IC module 186 for efficiency of heat delivery, the IC module 186 is in danger of being damaged.

In order to solve the aforementioned problem, a TIP (thermal interface pad) 188 made up of a material of a high heat conductivity rate and elastic can be inserted into the space between the shield can 187 and the IC module 186. Since heat is able to be delivered to the shield can 187 via the TIM 188 using a heat conductivity scheme, a heat delivery efficiency rate increases and the IC module 186 can be protected due to the elasticity of the TIM.

The cooling barrel 400 can be additionally installed in the outside of the case of the watch type mobile terminal 100 or the cooling barrel itself may construct a part of the case as well. An internal side of the cooling barrel is a side on which electronic apparatus is mounted. Such electronic parts as a battery 191 and the like can be mounted on the inside of the cooling barrel.

Figure 21:
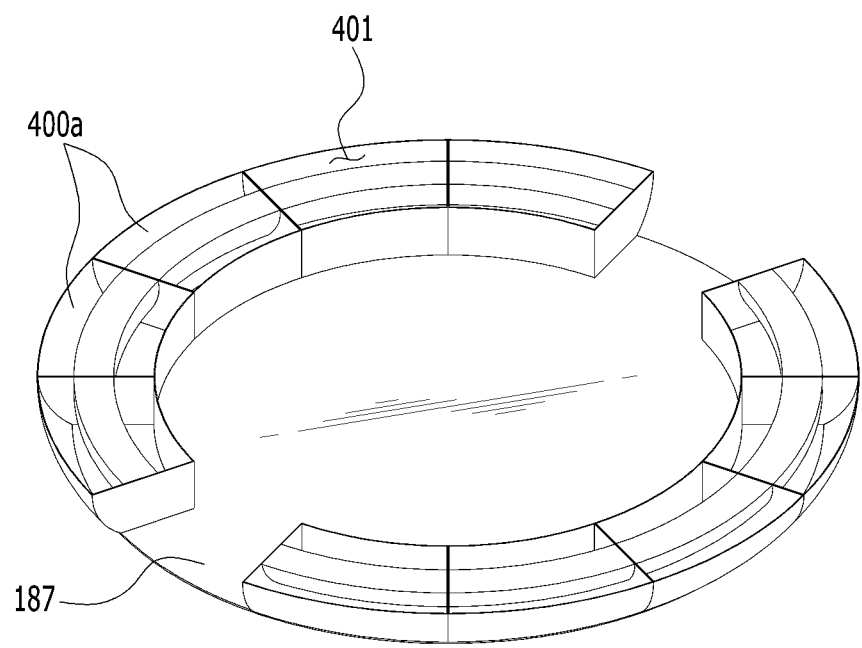
FIG. 21 is a diagram for a cross section of a cooling barrel part of a watch type mobile terminal according to one embodiment of the present invention.

The cooling barrel 400 can include a curved side to induce a fluid circulating in the cooling barrel to be flowed. FIG. 21 shows a cooling barrel including an internal side configured by a straight line to utilize an internal space 401 and an external side configured by a curved side to expedite convection of heat.

According to the Bernoulli's principle, which determines the velocity of a moving fluid according to a width of a flow path in which air is moving, the velocity of the moving fluid becomes slow in a part where an area of the flow path is wide and the velocity of the moving fluid becomes fast in a part where an area of the flow path is narrow. If the velocity of the moving fluid is fast, a new fluid is constantly flowed in and it is beneficial for absorbing ambient heat. If the velocity of the moving fluid is slow, heat stored in the moving fluid can be radiated while the moving fluid is moving slowly.

If the internal space 401 of a donut shape of the cooling barrel is formed by a narrow internal side (B) and a wide external side (A), a heat absorption rate can be increased in a manner that an internal moving fluid moves fast in a part configured to absorb heat and heat of the moving fluid can be sufficiently radiated in a manner that the internal moving fluid moves slowly in a part configured to radiate heat.

A heat radiation pin 410 can be further included in the external side of the cooling barrel 400. Since a moving fluid of high temperature is positioned at the top of the cooling barrel 400, as shown in FIG. 20, the heat radiation pin 410 can be positioned at the top of the cooling barrel 400 to increase a heat emission efficiency. The heat radiation pin can be positioned at the side of the cooling barrel as well.

The heat radiation pin 410 expands an area of a surface used for emitting heat using a material of a high heat conductivity rate to increase the heat emission efficiency. As shown in FIG. 19, since the heat radiation pins are arranged to circumstance of a front side of the watch type mobile terminal 100, the heat radiation pins can be transformed by various shapes in consideration of a design aspect.

FIG. 21 is a diagram for a cross section of a cooling barrel 400 part of a watch type mobile terminal 100 according to one embodiment of the present invention. The cooling barrel 400 can be divided into a plurality of cells 400*a*. If the cooling barrel is configured by a plurality of the cells 400*a*, since an internal space 401 of the cooling barrel 400 becomes narrower, circulation may be more facilitated. When temperature of a specific part of the watch type mobile terminal increases, if whole of the cooling barrel 400 is configured by a single space, circulation of a moving fluid is tardy. On the contrary, if the cooling barrel is configured by a plurality of the cells, a moving fluid of the cell in which temperature is went up can be circulated only. Hence, radiation of heat can be easily performed.

Figure 22:
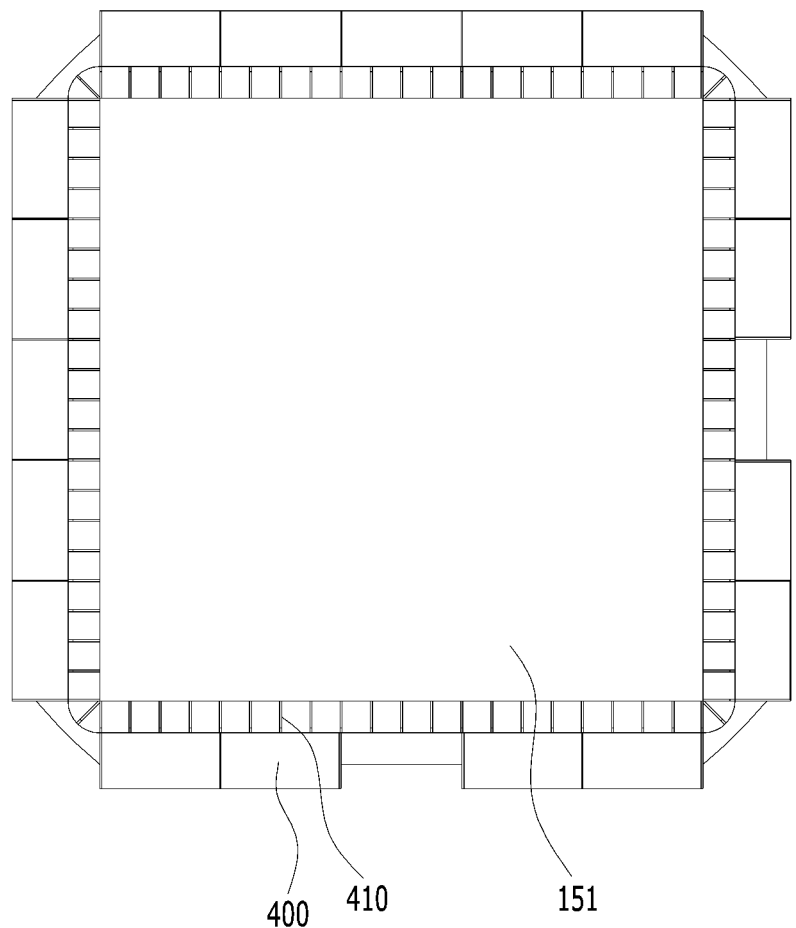
FIG. 22 is a diagram for a watch type mobile terminal according to a different embodiment of the present invention.
Figure 23:
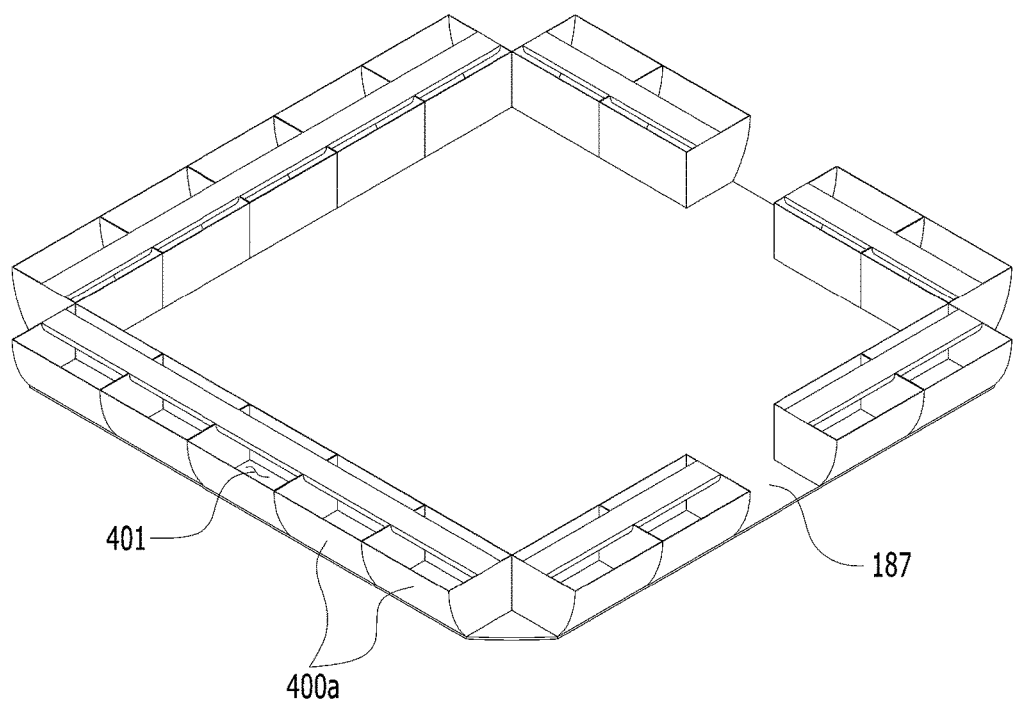
FIG. 23 is a diagram for a cross section of a barrel part of a watch type mobile terminal according to a different embodiment of the present invention.

FIG. 22 is a diagram for a watch type mobile terminal 100 according to a different embodiment of the present invention and FIG. 23 is a diagram for a cross section of a barrel part of a watch type mobile terminal 100 according to a different embodiment of the present invention. Unlike the aforementioned embodiment, the present embodiment can also applied to a watch type mobile terminal 100 of a rectangle form. A cooling barrel 400 can be arranged to a circumstance of the watch type mobile terminal 100 in a manner of configuring the cooling barrel with a plurality of cells 400*a*.

As shown in FIG. 22, the cooling barrel 400 can be partly omitted for such a part exposed to a side of a case 101*a*/101*b* as an interface unit 160, an audio output unit 153, microphone 122, a user input unit 123 and the like. The cooling barrel 400 of the watch type mobile terminal 100 can also include a curved side in an external side of the cooling barrel to expedite circulation of a moving fluid.

According to at least one or more embodiments of the present invention, it is able to improve a function of radiating heat using a heat convection phenomenon without using power.

Since a watch type mobile terminal is able to radiate heat from a band 102 using a heat pipe 210, malfunction of the watch type mobile terminal can be reduced.

Compared to a legacy scheme used to diffuse heat with a heat conductivity scheme using a heat radiation plate made up of such a material of a high heat conductivity rate as a copper plate or a graphite sheet, a convection scheme has a heat conductivity rate higher than the legacy scheme.

The foregoing embodiments are merely exemplary and are not to be considered as limiting the present disclosure. The present teachings can be readily applied to other types of methods and apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A watch type mobile terminal, comprising:
    a main body configured to contain an electric apparatus unit in which an electronic part is mounted;
    a band configured to be worn on a wrist of a user in a manner of being combined with the main body;
    a heat pipe configured to contain a first pipe positioned at the main body and a second pipe positioned at the band wherein the first pipe and the second pipe forms a loop in a manner of being connected with each other;
    a first working fluid injected into the heat pipe; and
    a second working fluid different from the first working fluid in density.

2. The watch type mobile terminal of claim 1, wherein the first pipe is configured to be arranged in the vicinity of a main board mounted on the main body.

3. The watch type mobile terminal of claim 1, wherein the first pipe is configured to be arranged according to outskirts of the main body.

4. The watch type mobile terminal of claim 3, wherein the heat pipe is configured to be formed by a transparent material, wherein a position of the band corresponding to the heat pipe is transparent and wherein the band is configured to further contain a powder or a piece inserted into the first working fluid or the second working fluid.

5. The watch type mobile terminal of claim 3, further comprising a powder or a piece, the powder or the piece injected into the inside of the heat pipe, the powder or the piece similar to the first working fluid or the second working fluid in density, the powder or the piece of a high heat conductivity rate.

6. The watch type mobile terminal of claim 1, wherein a cross sectional area of the first pipe is thinner than a cross sectional area of the second pipe.

7. The watch type mobile terminal of claim 1, wherein the band is configured to further contain an insulator formed on a first side which is in contact with a body of the user.

8. The watch type mobile terminal of claim 1, wherein the band is configured to further contain a heat radiating bump formed on a second side which is not in contact with a body of the user.

9. The watch type mobile terminal of claim 1, wherein the second pipe is configured to further contain a velocity reducing bump formed on a surface of a side adjacent to a body of the user.

10. The watch type mobile terminal of claim 1, further comprising a metallic ball positioned at the inside of the heat pipe,
    wherein a density of the metallic ball is heavier than a density of the first working fluid and a density of the second working fluid.

11. The watch type mobile terminal of claim 1, further comprising a heat absorption bar positioned at the inside of the heat pipe,
    wherein a density of the heat absorption bar corresponds to a median value between a density of the first working fluid and a density of the second working fluid.

* * * * *